(12) United States Patent
Koontz et al.

(10) Patent No.: US 7,026,232 B1
(45) Date of Patent: Apr. 11, 2006

(54) SYSTEMS AND METHODS FOR LOW LEAKAGE STRAINED-CHANNEL TRANSISTOR

(75) Inventors: Elisabeth Marley Koontz, Dallas, TX (US); Antonio Luis Pacheco Rotondaro, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/021,020

(22) Filed: Dec. 23, 2004

(51) Int. Cl.
*H01L 21/3205* (2006.01)
*H01L 21/4763* (2006.01)
*H01L 21/76* (2006.01)
*H01L 21/336* (2006.01)

(52) U.S. Cl. .................. 438/589; 438/297; 438/439; 438/647

(58) Field of Classification Search ............. 438/589, 438/225, 297, 439, 452, 647
See application file for complete search history.

(56) References Cited

U.S. PATENT DOCUMENTS

| | | | |
|---|---|---|---|
| 6,121,100 A * | 9/2000 | Andideh et al. | 438/305 |
| 6,165,826 A * | 12/2000 | Chau et al. | 438/231 |
| 6,207,482 B1 * | 3/2001 | Shih et al. | 438/199 |
| 6,214,679 B1 * | 4/2001 | Murthy et al. | 438/299 |
| 6,261,935 B1 * | 7/2001 | See et al. | 438/592 |
| 6,306,702 B1 * | 10/2001 | Hao et al. | 438/231 |
| 6,352,903 B1 * | 3/2002 | Rovedo et al. | 438/387 |
| 6,368,926 B1 * | 4/2002 | Wu | 438/300 |
| 6,475,853 B1 * | 11/2002 | Asamura | 438/225 |
| 6,522,571 B1 | 2/2003 | Salling | |
| 6,541,343 B1 * | 4/2003 | Murthy et al. | 438/299 |
| 6,797,556 B1 * | 9/2004 | Murthy et al. | 438/231 |
| 2004/0068674 A1 | 4/2004 | Rodriguez et al. | |

* cited by examiner

*Primary Examiner*—Chuong Anh Luu
(74) *Attorney, Agent, or Firm*—Peter K. McLarty; W. James Brady, III; Frederick J. Telecky, Jr.

(57) ABSTRACT

The present invention facilitates semiconductor fabrication by providing methods of fabrication that mitigate leakage and apply strain to channel regions of transistor devices. A semiconductor device having gate structures, channel regions, and active regions is provided (102). Extension regions of a first type of conductivity are formed within the active regions (104). Recesses are then formed within a portion of the active regions (106). Second type recess structures are formed (108) within the recesses, wherein the second type recess structures have a second type of conductivity opposite the first type and are comprised of a strain inducing material. Then, first type recess structures are formed (110) within the recesses and on the second type recess structures, wherein the first type recess structures have the first type of conductivity and are comprised of a strain inducing material.

22 Claims, 9 Drawing Sheets

SYSTEMS AND METHODS FOR LOW LEAKAGE STRAINED-CHANNEL TRANSISTOR

FIELD OF INVENTION

The present invention relates generally to semiconductor devices and more particularly to transistor devices and associated methods of manufacture having improved mobility due to channel strain.

BACKGROUND OF THE INVENTION

A conventional MOS transistor generally includes a semiconductor substrate, such as silicon, having a source, a drain, and a channel positioned between the source and drain. A gate stack composed of a conductive material (a gate conductor), a dielectric layer (a gate oxide), and sidewall spacers, is typically located above the channel. The gate oxide is typically located directly above the channel, while the gate conductor, generally comprised of polycrystalline silicon (polysilicon) material, is located above the gate oxide. The sidewall spacers protect the sidewalls of the gate conductor and define the source and drain placement relative to the gate.

Generally, for a given electric field across the channel of a MOS transistor, the amount of current that flows through the channel is directly proportional to the mobility of carriers in the channel. Thus the higher the mobility of the carriers in the channel, the more rapidly the carriers will pass through the channel and the faster a circuit can perform when using high mobility MOS transistors. Additionally, improving the mobility of the carriers in the channel can allow device operation at lower voltages.

A number of techniques can be employed to improve mobility of the carriers in the channel. One technique is to place the direction of the channel, and thus the carrier flow, with a certain alignment regarding one of the substrate crystal planes (e.g., 100). The drawback of this technique is that a given orientation that would be beneficial to one carrier type (e.g., holes) would not benefit the other carrier mobility.

Another technique to increase the mobility of the carriers in the channel of an MOS transistor is to produce a mechanical stress or strain in the channel. A compressive strained channel typically provides hole mobility enhancement, which is particularly beneficial for PMOS devices, whereas a tensile strained channel typically provides electron mobility enhancement, which is particularly beneficial for NMOS devices. Generally, a layer is formed adjacent to the channel that has a lattice mismatch between the formed layer and the substrate and channel. The lattice mismatch then induces strain across a channel region.

One drawback to improving channel mobility via strain is that compressive strain, which generally improves hole mobility for silicon substrate devices, can degrade electron mobility and that tensile strain, which improves electron mobility for silicon substrate based devices, can also degrade hole mobility. As a result, introducing tensile strain can improve performance of NMOS devices but degrade performance of PMOS devices. Similarly, introducing compressive strain can improve performance of PMOS devices but degrade performance of NMOS devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor device fabrication by inducing strain, relatively deeply, into channel regions of semiconductor devices. The present invention employs multiple recess structures that can have varied dopant type, dopant profile, and/or compositions in order to maintain or facilitate device operation while also selectively applying strain to channel regions.

In accordance with one aspect of the invention, recesses are formed in active regions of a semiconductor device after formation of gate structures by removing a surface portion of at least a portion of the active regions. Subsequently, a first strain inducing structure is formed in the recessed portions having a dopant type and concentration substantially similar to a well region formed therein. Then, a second strain inducing structure is formed on the first strain inducing structure, wherein the second strain inducing structure has a dopant type and concentration substantially similar to extension regions. Other aspects of the invention are disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
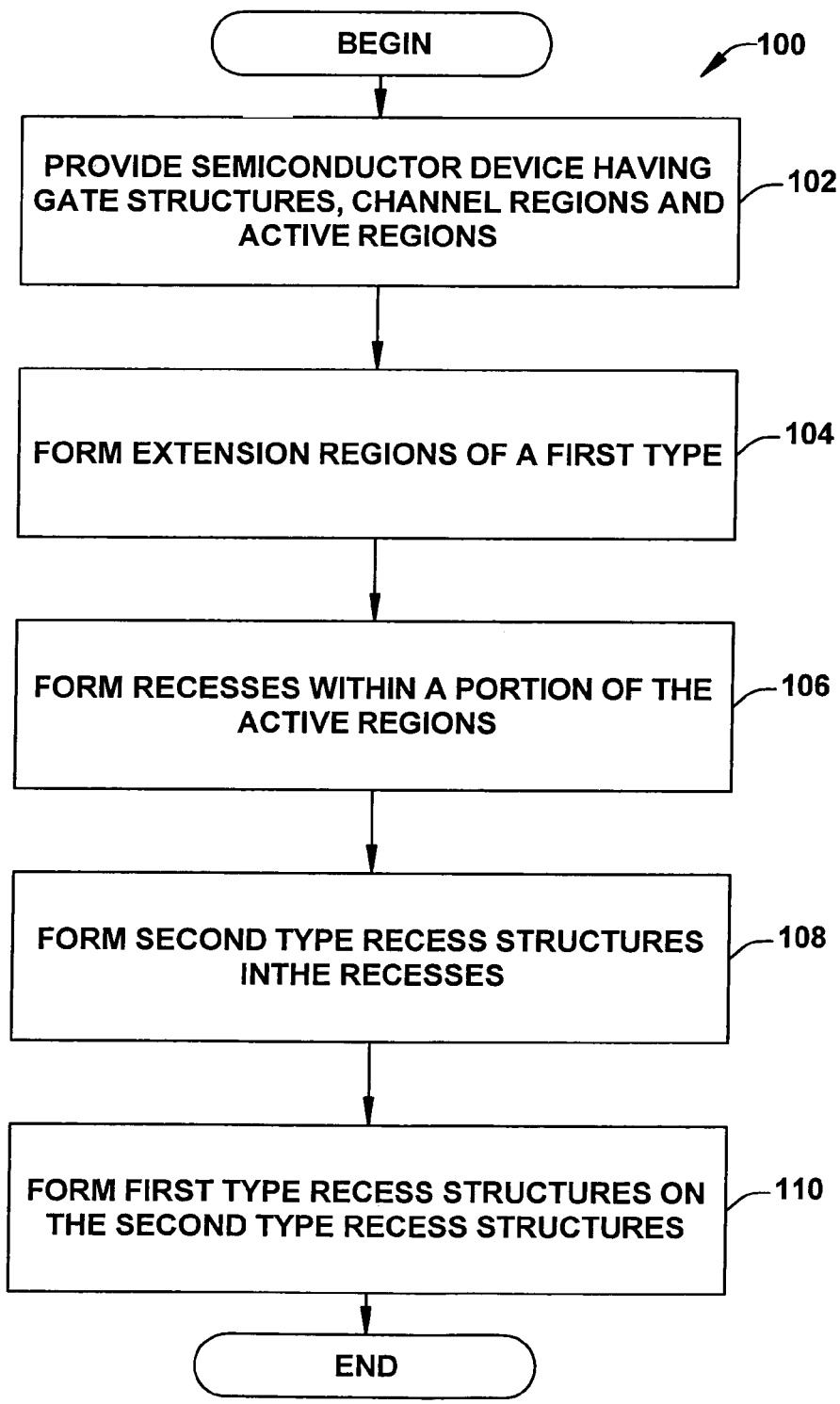
FIG. 1 is a flow diagram illustrating a method of fabricating a semiconductor device that applies channel strain to channel regions of transistor devices located within NMOS and/or PMOS regions of a semiconductor device in accordance with an aspect of the present invention.

One or more implementations of the present invention will now be described with reference to the attached drawings, wherein like reference numerals are used to refer to like elements throughout, and wherein the illustrated structures are not necessarily drawn to scale. The invention provides transistor structures and methods in which transistor mobility is improved.

The present invention facilitates semiconductor device fabrication by inducing strain, relatively deeply, into channel regions of semiconductor devices. The present invention employs multiple recess structures that can have varied dopant type, dopant profile, and/or compositions in order to maintain or facilitate device operation while also selectively applying strain to channel regions. The multiple recess structures, by employment of strain inducing materials and dopant implanted, can apply strain to channel regions relatively deeply while mitigating leakage.

FIG. 1 is a flow diagram illustrating a method 100 of fabricating a semiconductor device that applies channel strain to channel regions of transistor devices located within NMOS and/or PMOS regions of a semiconductor device in accordance with an aspect of the present invention.

The method 100 begins at block 102, wherein a transistor semiconductor device having formed gate structures, defined channel regions, formed well regions, and defined active regions is provided. Typically, offset spacers adjacent the gate structures have been formed, but source/drain region formation has not been completed. The transistor device is either n-type or p-type (e.g., NMOS transistor or PMOS transistor).

Extension regions of a first type are formed within the active regions at block 104 by implanting a suitable dopant. The first type is n-type or p-type depending on the suitable dopant employed and the type of transistor being fabricated. Additionally, the extensions regions are formed with a conductivity or type (e.g., n-type or p-type) that is opposite that of the well regions and active regions formed therein. The energy and dose of the suitable dopant are typically selected to obtain a desired depth and dopant concentration/profile for the extension regions.

Continuing at block 106, a recess etch is performed on at least a portion of the active regions adjacent to the gate structure to from recesses having a selected depth in the substrate adjacent to the channel region. During the recess etch, material from surfaces of the active regions is removed thereby forming recessed regions. The recess etch is performed with a suitable etch methodology (e.g., substantially anisotropic) for a suitable time in order to form the recesses with a selected depth. A mask may be employed during recess region formation to cover portions of the semiconductor device, such as the gate structure and portions of the active region.

Second type recess structures are formed in bottom portions of the recesses at block 108. The second type recess structures are of an opposite conductivity type than the formed extension region and typically have similar dopant concentration and conductivity type as the well regions that they are formed in. The second type recess structures are formed by depositing, typically via an epitaxial deposition process, a strain inducing material such as silicon-germanium and/or silicon-carbon (depending on the substrate composition and the type of strain desired) starting at a bottom of the recesses in the presences of a suitable dopant. The dopant concentration and conductivity type of the second type recess structures are controlled and/or obtained by employing a suitable doping mechanism during formation of the second type recess structures. The similarity of the dopant concentration and conductivity of the second type recess structures and the well regions permit application of strain deeper in the channel region while providing operating characteristics similar to other portions of the well regions.

The strain inducing material and composition is selected to provide a desired amount and type of strain, such as, uniaxial or biaxial tensile strain and uniaxial or biaxial compressive strain. Generally, uniaxial or biaxial tensile strain promotes or improves electron mobility and is employed in NMOS devices to improve performance. Similarly, uniaxial or biaxial compressive strain promotes or improves hole mobility and is typically employed in PMOS devices to improve device performance. An example of a compressive strain producing material is silicon-germanium and an example of a tensile strain producing material is silicon-carbon. However, it is appreciated that other suitable strain inducing materials can be employed.

Continuing with the method 100, first type recess structures are formed within the recesses and on top of the second type recess structures at block 110. The first type recess structures are of an opposite conductivity type than the second type recess structures and share the conductivity type of the formed extension regions. Additionally, the first type recess structures are typically formed with a dopant concentration substantially similar to the formed extension regions.

The first type recess structures are formed by depositing, typically via an epitaxial process, a strain inducing material such as silicon-germanium and/or silicon-carbon starting an upper surface of the second type recess structures. Both the first and second type recess structures have different lattice constants than the neighboring semiconductor substrate, thereby inducing strain into the neighboring channel regions. As with the second type recess structures, the strain inducing material and composition employed is selected to provide a desired amount and type of strain, such as, uniaxial or biaxial tensile strain and uniaxial or biaxial compressive strain. The dopant concentration and conductivity type of the first type recess structures are controlled and/or obtained by employing a suitable doping mechanism during formation of the first type recess structures. Generally, both the first and second type recess structures are formed with the same strain inducing material therein. However, the composition of the strain inducing material can be varied, such as altering the atomic concentration of germanium in silicon-germanium.

Typically, the formed first type recess structures overfill the recesses by an overfill amount. Composition of the first and second type recess structures can be controlled by, for example, adjusting gas flows during formation in order to tailor strain induced by the structures. The composition of the recess structure may also account for a shape of the recesses and/or a shape of the formed recess structures. As an example, the germanium content of silicon-germanium can be increased in order to increase the compressive strain and decreased in order to decrease the compressive strain applied to the channel region. As another example, the carbon content of silicon-carbon can be increased in order to increase the tensile strain and decreased in order to decrease the tensile strain applied to the channel region.

The dopant concentration of the second type recess structures can be relatively similar to the substrate and/or well regions formed therein. As a result, the resistivity of the second type recess structures is similar to that of the substrate and/or well regions, which can mitigate transistor leakage via a reduced bandgap of the strain inducing material to the semiconductor substrate material. Alternately, the dopant concentration can be of the same conductivity type as the well region formed within, but with a higher dopant concentration to, for example, mitigate leakage current.

It is noted that the present invention contemplates suitable variations of the method 100. For example, sidewall spacers can be formed prior to formation of the recesses. Additionally, the extension regions can be formed after formation of the first and second type recess structures. Also, the recesses as well as the first and second type recess structures formed therein can be formed in substantially all of the active regions instead of only a portion thereof.

Figure 2A:
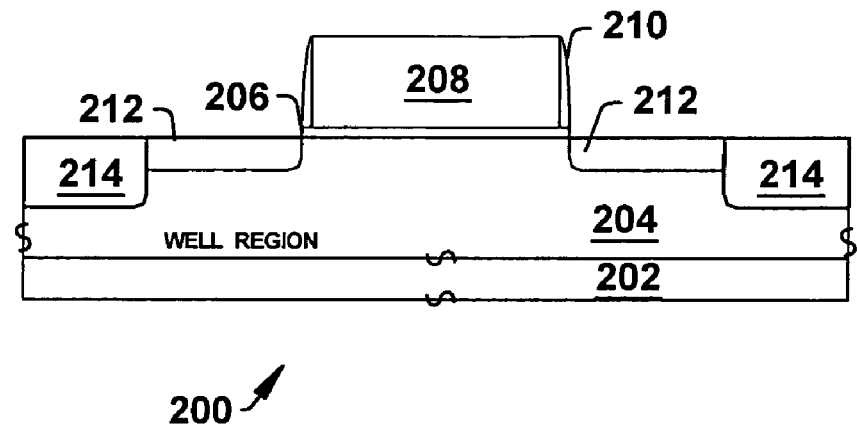
FIG. 2A is a diagram illustrating a conventional semiconductor transistor device 200.

FIG. 2A is a diagram illustrating a conventional semiconductor transistor device 200. The device 200 is depicted in order to facilitate comparison with devices in accordance with the present invention.

The device 200 includes a well region 204 formed within a semiconductor substrate or body 202. A relatively thin gate oxide 206 is formed on a surface of the well region 204 and a polysilicon gate is 208 is formed onto the gate oxide 206. Both the gate oxide 206 and the polysilicon gate 208 are patterned to form a gate structure.

Offset spacers 210 are formed on lateral sides of the gate structure to assist in subsequent formation processes and protect the gate structure therefrom. Extension regions 212 are formed within active regions of the device 200 by implanting a suitable dopant with a relatively low energy in the active regions. The suitable dopant employed results in the extension regions 212 having a conductivity opposite that of the well region 204. Source/drain regions 214 are defined within the well region 204 and share the conductivity type of the extension regions. However, the source/drain regions 214 typically have a higher dopant concentration and are formed deeper than the extension regions 212.

Figure 2B:
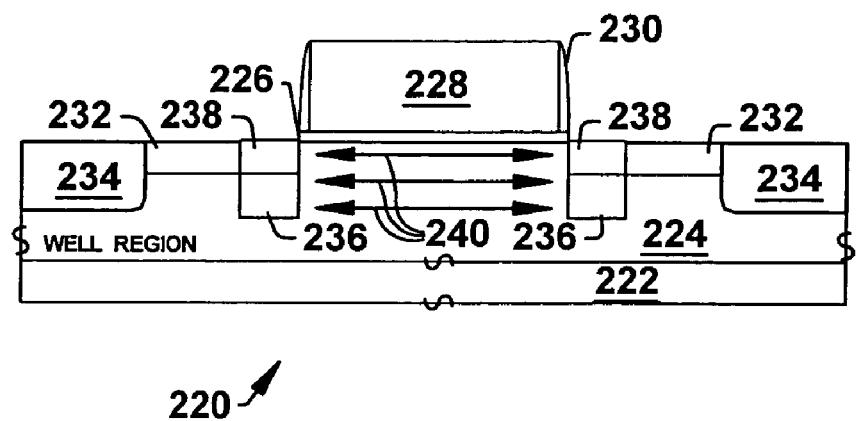
FIG. 2B is a diagram illustrating a semiconductor transistor device comprising multiple recess structures in accordance with an aspect of the present invention.

FIG. 2B is a diagram illustrating a semiconductor transistor device 220 comprising multiple recess structures within the substrate in accordance with an aspect of the present invention. The multiple recess structures apply strain to a channel region of the device 220 and can have varying compositions, conductivity (e.g., n-type or p-type), and dopant concentration.

The device 220 comprises a well region 224 formed within a semiconductor substrate or body 222. The semiconductor substrate 222 is comprised of a semiconductor material, such as silicon. The semiconductor substrate 222 can be slightly doped or un-doped. The well region 224 has a selected depth and dopant concentration that is attained during well formation processes. The well region 224 has a conductivity type resulting from one or more implanted dopants that is suitable for the device 220 (e.g., n-type conductivity for p-type or PMOS transistor devices and p-type conductivity for n-type or NMOS transistor devices.

A relatively thin gate oxide 226 is formed on a surface of the well region 224 and a gate electrode 228 is formed over the gate oxide 226. The gate oxide 226 is comprised of an insulative/dielectric material such as oxide and the gate electrode 228 is comprised of a conductive material such as polysilicon. Both the gate oxide 226 and the gate electrode 228 are patterned to form a gate structure.

Offset spacers 230 are formed on lateral sides of the gate structure to assist in subsequent formation processes and protect the gate structure there from. The offset spacers 230 are generally formed by depositing an insulative material, such as oxide, and then performing an anisotropic etch. Extension regions 232 are formed within active regions of the device 220 by implanting a suitable dopant with a relatively low energy in the active regions. The suitable dopant employed results in the extension regions 232 having a conductivity opposite that of the well region 224. Source/drain regions 234 are defined within the well region 224 and share the conductivity type of the extension regions. However, the source/drain regions 234 typically have a higher dopant concentration and are formed deeper than the extension regions 232.

First recess structures 236 are formed within the well region 224 and below the extension regions 232. The first recess structures 236 are comprised of a strain inducing material such as silicon-germanium and silicon-carbon that cause tensile or compressive strain to be applied to the channel region of the device 220. Furthermore, the first recess structures 236 have a dopant conductivity type and concentration compatible and/or substantially similar to that of the well region 224.

Second recess structures 238 are formed within the extension regions 232 and the well region 224 and are also comprised of a strain inducing material that causes tensile or compressive strain to be applied to the channel region of the device 220.

The first recess structures 236 and the second recess structures 238, collectively, apply or induce strain 240 relatively deeply within the channel region (e.g., by having the same strain inducing material therein). Conventional semiconductor devices either fail to apply strain or do not apply strain as deeply as the first recess structures permit. That is, such regions were not deeper than the extension regions 232. Since the recesses extended deeper into the well 224 and the first structures 236 is the same dopant/conductivity type as the well 224, the electrical behavior of the device is maintained and the mobility is enhanced by creating uniform stress within the entire depth of the channel. It is also appreciated that variations of the device 220 are contemplated in accordance with the present invention. For example, more than two recess structures can be employed to apply strain and operability to the device 220.

Figure 3:
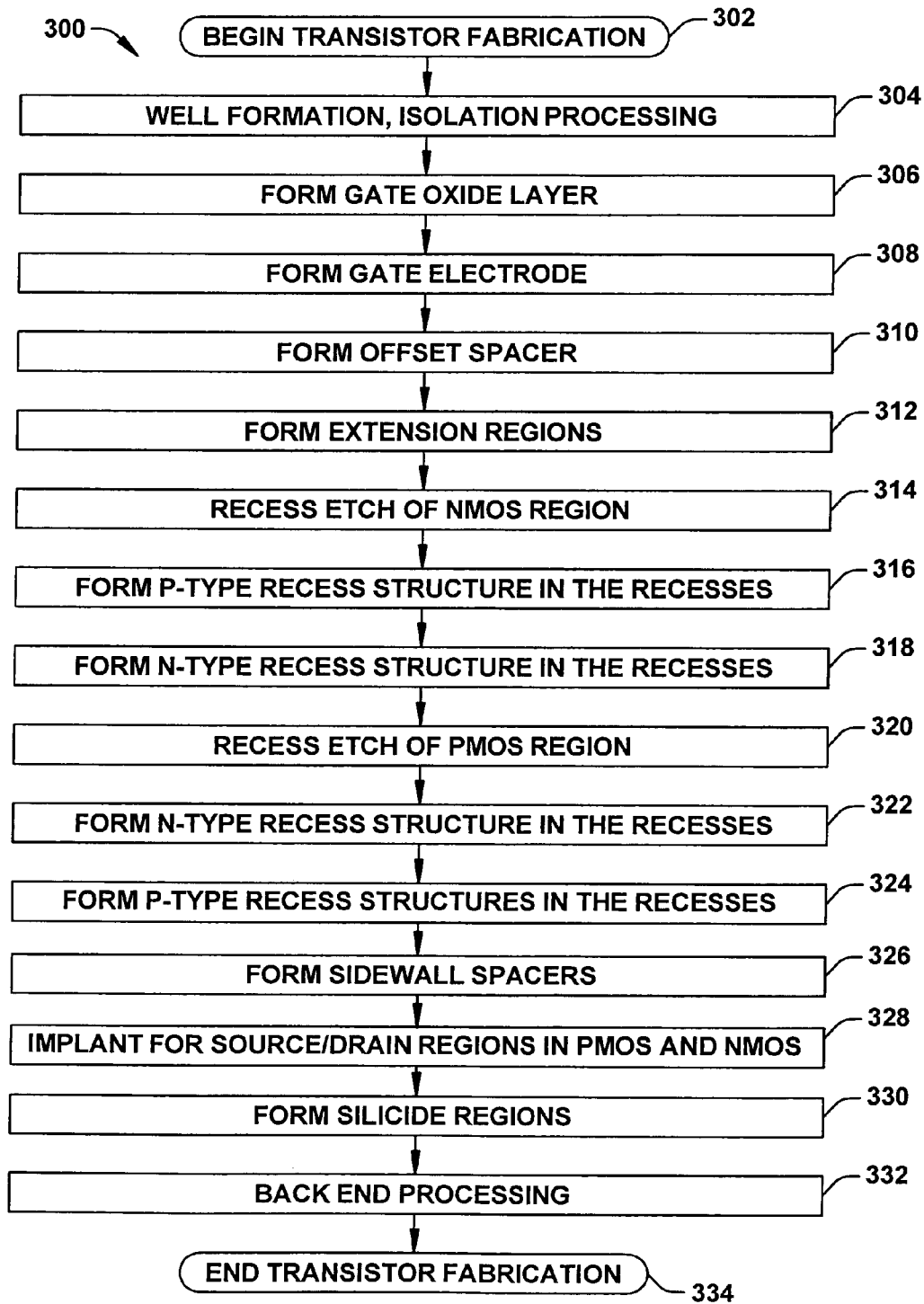
FIG. 3 is a flow diagram illustrating a method of fabricating a semiconductor device having multiple recess structures that apply strain in accordance with an aspect of the present invention.

FIG. 3 is a flow diagram illustrating a method 300 of fabricating a semiconductor device having multiple recess structures that apply strain in accordance with an aspect of the present invention. While the exemplary method 300 is illustrated and described below as a series of acts or events, it is appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement the method 300 in accordance with the present invention. Furthermore, the method 300 according to the present invention may be implemented in association with the fabrication of ICs and composite transistors illustrated and described herein, as well as in association with other transistors and structures not illustrated, including but not limited to NMOS and/or PMOS composite transistors.

The method 300 begins at 302, wherein transistor fabrication is initiated, and transistor well formation and isolation processing is performed at 304 thereby defining NMOS and PMOS regions, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) that serve to define various active areas and electrically isolate various active areas laterally from one another.

The method 300 continues at 306, wherein a gate oxide layer is formed in active areas defined by the various formed isolation regions. In one example, the gate oxide comprises a thin, thermally grown silicon dioxide layer, however, other type gate dielectrics (such as high-k dielectrics) may be formed and are contemplated by the present invention. A conductive gate layer is then deposited over the gate oxide at 308 and patterned to form a conductive gate electrode. For example, a polysilicon layer may be deposited via chemical vapor deposition (CVD) and patterned via etching to form gate electrodes in both NMOS and PMOS regions, respectively.

An offset spacer is then formed on lateral edges of the conductive gate electrodes at 310. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate.

An extension region implant is then performed at 312 to form extension regions, wherein dopants are introduced into active regions of the device. The active regions are located within the semiconductor substrate and outside of the gate structures. In an exemplary extension region formation process, lightly doped, medium doped or heavily doped extension region implants are performed in the NMOS and PMOS regions, respectively, wherein the gate structure serves to self-align the extension regions. A thermal process such as a rapid thermal anneal can then be employed to activate the extension region dopants, which causes the extension regions to diffuse laterally slightly underneath the offset spacer toward the channels.

A mask is applied that exposes a portion of the active regions and the extension regions within the NMOS region and a recess etch is performed at block 314. The recesses are formed to a depth below the extension regions, for example a depth of about 30 nm to about 300 nm. In one example, the recesses are formed using a dry etching process, such as the chemistry employed to etch STI trenches in the semiconductor body when forming isolation regions. It is noted that the portion of the active regions exposed can vary in accordance with the present invention. For example, the portion can comprise a relatively small region or portion of the active regions near the gate structure or can comprise the entire active region.

P-type strain inducing structures are then formed in the recesses at block 316 within the NMOS region. The p-type strain inducing structures are typically formed via an epitaxial deposition process that starts forming the structures at upper surfaces of the n-type strain inducing structures. The p-type structures are formed substantially below the extension regions and have p-type conductivity and a dopant concentration similar to surrounding portions of the well regions. The p-type structures are comprised of a strain inducing material such as silicon-germanium or silicon-carbon and have a composition selected to provide a desired amount of strain.

An exemplary process form forming silicon carbon is a selective epitaxial deposition process such as an LPCVD (low pressure chemical vapor deposition) process. By using a carbon containing gas source, such as C2H4, the silicon material formed in the recesses can be doped with carbon in-situ. The flow of the source gases can be controlled during the deposition or formation to alter the composition of the silicon-carbon. The silicon-carbon within the recesses form an alloy that has a lattice with the same structure as the silicon body lattice, however, the silicon-carbon alloy has a smaller spacing. Consequently, the silicon-carbon within the recesses will tend to contract, thereby creating a tensile stress within the channel regions.

N-type strain inducing structures are subsequently formed in the recesses on the p-type strain inducing structures at block 318. Similarly, the n-type strain inducing structures are typically formed via an epitaxial deposition process that starts forming the structures at bottoms of the recesses. The n-type structures are formed substantially within the extension regions and on the p-type strain inducing structures. Additionally, the n-type structures are formed having n-type conductivity and a dopant concentration similar the formed extension regions. As with the p-type strain inducing structures, the n-type structures are comprised of a strain inducing material such as silicon-germanium or silicon-carbon and have a composition selected to provide a desired amount of strain. It is noted that the strain inducing material and/or the composition can vary for the p-type strain inducing structures and the n-type strain inducing structures in order to selectively apply strain to the channel regions. Additionally, it is noted that within the p-type strain inducing structures and the n-type strain inducing structures, the composition of the strain inducing material can be tailored to selectively apply strain to the channel regions.

A mask is applied that exposes a portion of the active regions and the extension regions within the PMOS region and a recess etch is performed at block 320. The recesses are formed to a depth below the extension regions, for example a depth of about 30 nm to about 300 nm. An example of a suitable recess etch process is a dry etching process, such as the chemistry employed to etch STI trenches in the semiconductor body when forming isolation regions.

N-type strain inducing structures are then formed in the recesses at block 322 within the PMOS region. The n-type strain inducing structures are typically formed via an epitaxial deposition process that starts forming the structures at bottoms of the recesses. The n-type structures are formed substantially below the extension regions and have n-type conductivity and a dopant concentration similar to surrounding portions of the well regions of the PMOS region. The n-type structures are comprised of a strain inducing material such as silicon-germanium or silicon-carbon and have a composition selected to provide a desired amount of strain. Typically, the strain inducing material employed for the PMOS region, such as silicon-germanium, produces a compressive strain.

A formation process for forming silicon germanium is an epitaxial process, such as, chemical vapor deposition (CVD) and/or molecular beam epitaxy (MBE), and the like. Source gases for silicon and germanium are employed to control the composition of the filled recess structures. The flow of the source gases and/or flux of source atoms can be controlled to alter the composition of the strain producing material and one or more n-type dopants can be introduced during the formation process.

P-type strain inducing structures are subsequently formed in the recesses on the n-type strain inducing structures at block 324. Similarly, the p-type strain inducing structures are typically formed via an epitaxial deposition process. The p-type structures are formed substantially within the extension regions and on the n-type strain inducing structures. Additionally, the p-type structures are formed having p-type conductivity and a dopant concentration similar the formed extension regions. As with the n-type strain inducing structures, the p-type structures are comprised of a strain inducing material such as silicon-germanium or silicon-carbon and have a composition selected to provide a desired amount of strain. It is noted that the strain inducing material and/or the composition can vary for the p-type strain inducing structures and the n-type strain inducing structures of the PMOS region in order to selectively apply strain to the channel regions. Additionally, it is noted that within the p-type strain inducing structures and the n-type strain inducing structures within the PMOS region, the composition of the strain inducing material can be tailored to selectively apply strain to the channel regions.

Still referring to FIG. 3, sidewall spacers are then formed on the gate structures at 326. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

Source/drain regions are then formed in the PMOS and NMOS regions by implanting p-type dopants (e.g., boron) in the PMOS region and n-type dopants (e.g. arsenic and/or phosphorous) in the NMOS region at block 328. Typically, an NSD mask is employed to expose the NMOS region and implant the n-type dopants and a PSD mask is employed to expose the PMOS region and implant the p-type dopants in a subsequent implantation. The source/drain dopants are introduced into the exposed areas (top of gate electrode and active areas not covered by the sidewall spacers). Subsequently, a thermal process can then be performed to activate dopants within the source/drain regions of both the NMOS and PMOS regions.

Subsequently, silicide processing is performed at block 330, wherein a refractory metal material is formed over the device, followed by a thermal process, wherein the metal and silicon interfaces react to form a silicide (on top of the gate and in the source/drain regions). Unreacted metal is then stripped away, and back end processing, such as interlayer dielectric and metallization layers formation, is performed at 332 to conclude the device formation at 334.

It is appreciated that suitable variations of the method 300 are contemplated and in accordance with the present invention. For example, sidewall spacers of block 326 can be formed prior to the recess etch at block 316 and formation of the strain inducing structures.

Figure 4A:
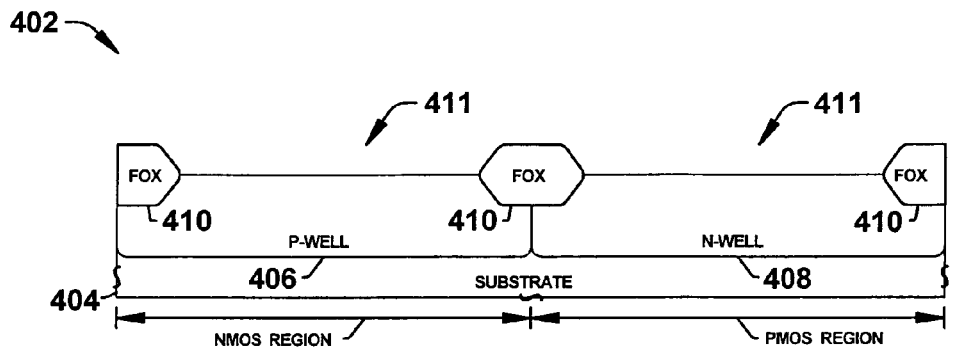
FIGS. 4A–4O are a plurality of fragmentary cross section diagrams illustrating a transistor device being formed in accordance with an aspect of the present invention.
Figure 4B:
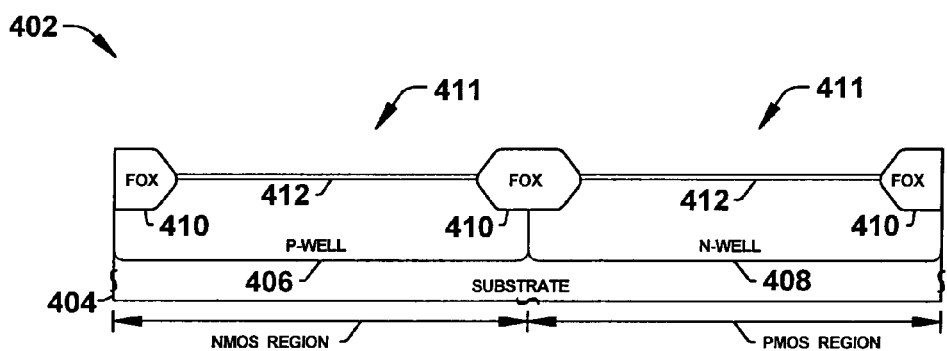
Figure 4C:
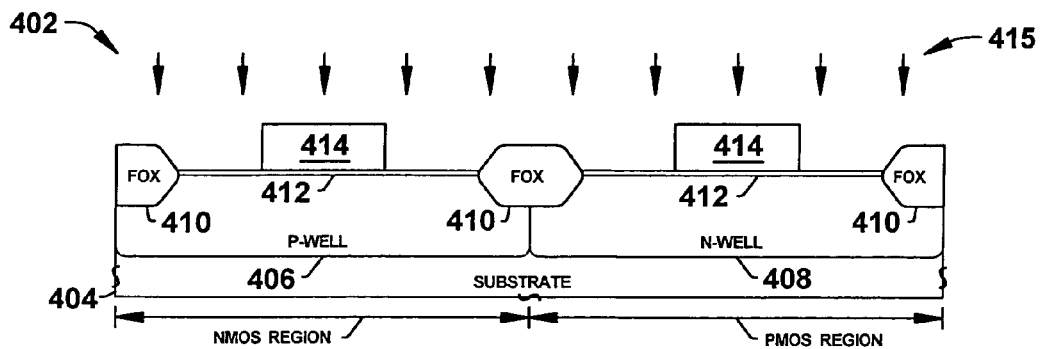
Figure 4D:
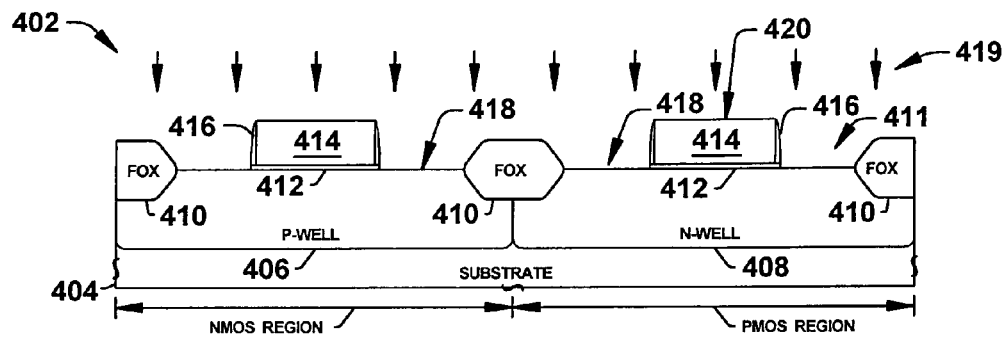
Figure 4E:
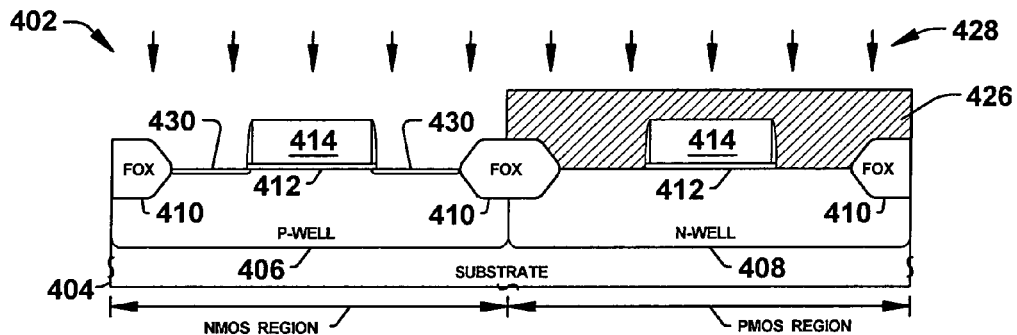
Figure 4F:
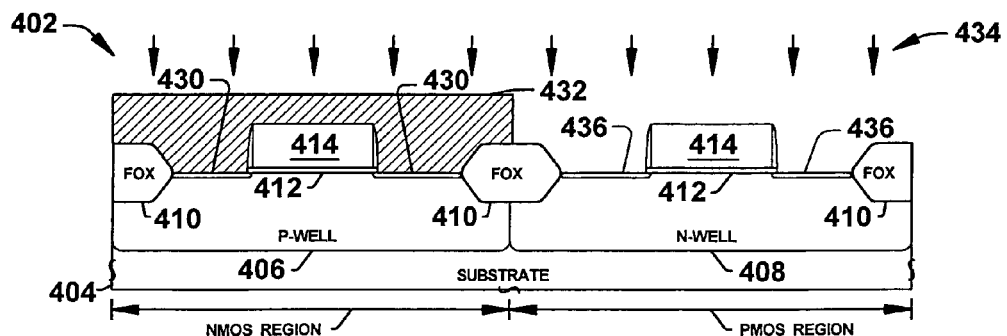
Figure 4G:
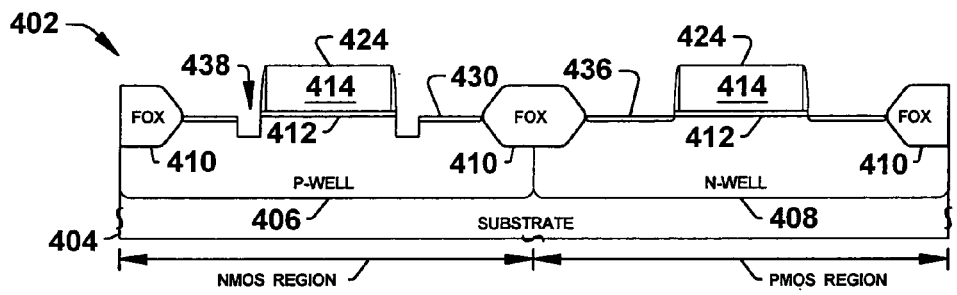
Figure 4H:
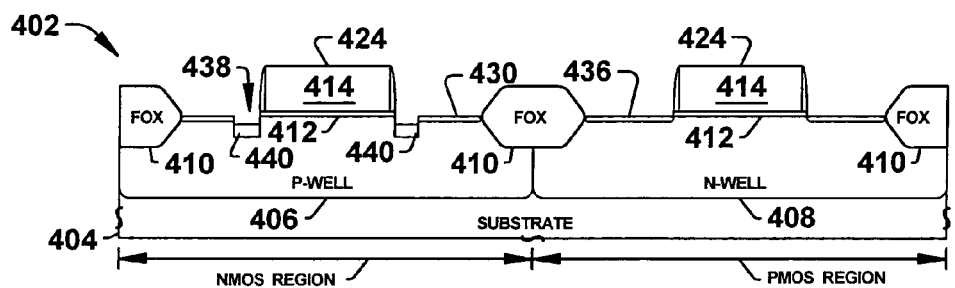
Figure 4I:
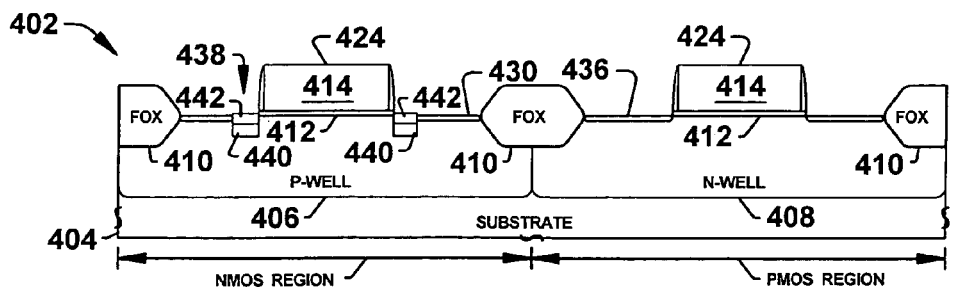
Figure 4J:
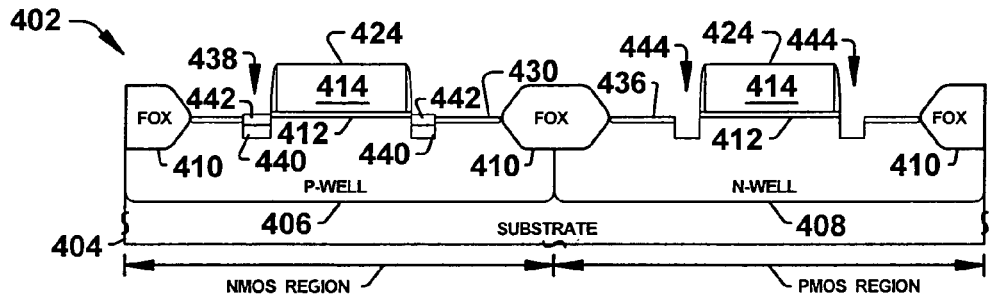
Figure 4K:
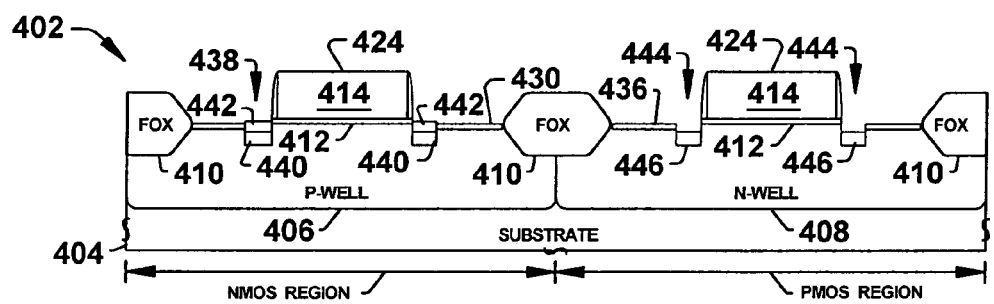
Figure 4L:
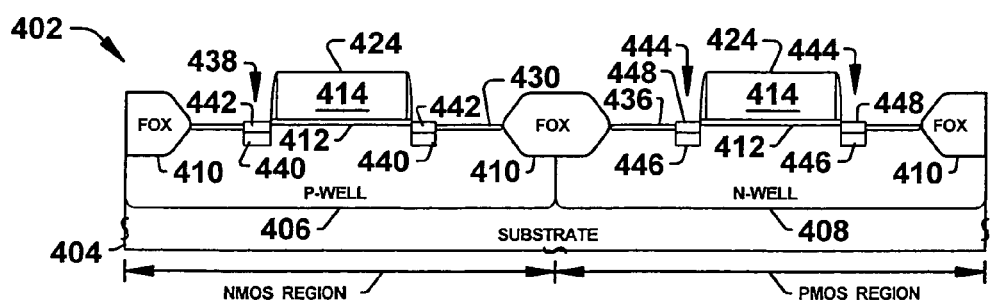
Figure 4M:
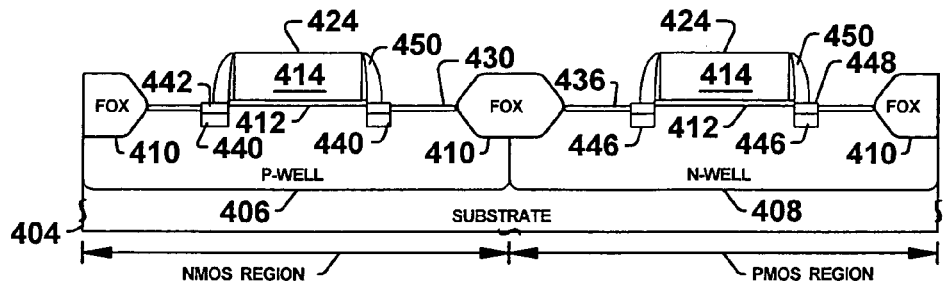
Figure 4N:
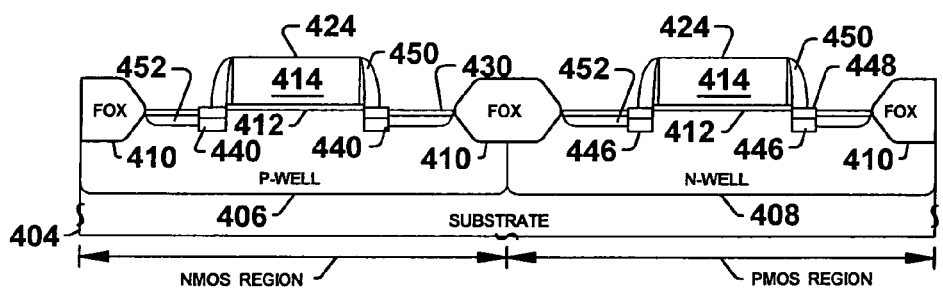
Figure 4O:
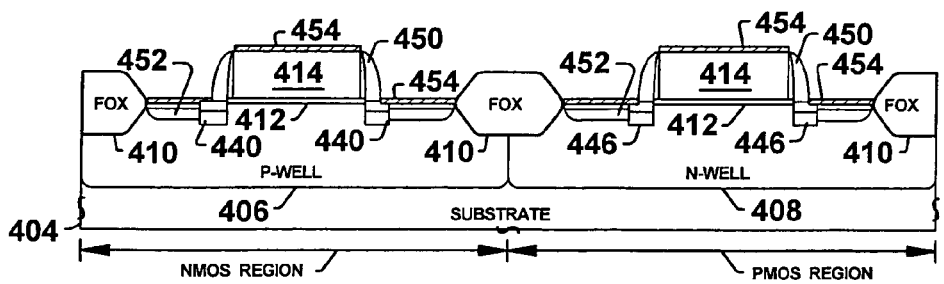

Turning now to FIGS. 4A–4O, a plurality of fragmentary cross section diagrams illustrating a transistor device being formed in accordance with the present invention of the method 300 of FIG. 3 is provided. In FIG. 4A, a transistor device 402 is provided, wherein a semiconductor body 404, such as a semiconductor substrate, has a number of wells formed therein, such as a P-well 406 to define an NMOS transistor device region and an N-well 408 to define a PMOS transistor device region, respectively. Further, isolation regions 410 such as STI regions are formed in the semiconductor body to define active area regions 411, as may be appreciated. In FIG. 4B, the transistor device 402 is illustrated, wherein a gate oxide 412 has been formed, for example, by thermally grown $SiO_2$, over the active regions 411.

Referring to FIG. 4C, a conductive gate electrode material (e.g., polysilicon) has been deposited and patterned via an etching process 415 to form a gate electrode 414 overlying the gate oxide 412. The gate oxide 412 is subsequently patterned via an etching process. Turning now to FIG. 4D, offset spacers 416 are then formed on the lateral edges of the gate electrode. The offset spacers are typically comprised of an insulative material such as oxide.

The PMOS region is then masked, as illustrated in FIG. 4E with a masking material 426 such as photoresist, and an extension region implant 428 is performed to form n-type extension regions 430 in the exposed NMOS region.

The n-type extension region mask 426 is then removed, and a p-type extension region mask 432 is deposited and patterned to cover the NMOS region and expose the PMOS region, as illustrated in FIG. 4F. A p-type extension region implant process 434 is then performed to form p-type extension regions 436 in the PMOS region, as illustrated. The mask 432 is then removed and a thermal process such as a rapid thermal anneal can be performed to activate the dopants, wherein a lateral diffusion of the extension regions 430 and 436 under the offset spacers 416 can be achieved.

FIG. 4G illustrates the device 402 after formation of recesses 438 within the NMOS region. A mask (not shown) is applied that exposes a portion of the active regions 411 and the extension regions 430 within the NMOS region. Subsequently, a recess etch is performed to form the recesses 438. A sacrificial spacer (not shown) can be formed adjacent the offset spacers 416 to facilitate performance of the recess etch. The recesses 438 are shown as comprising a portion of the active region, but can, in alternate aspects, comprise the entire active region.

P-type strain inducing structures 440 are then formed in the recesses 438 as shown in FIG. 4H. The p-type strain inducing structures are typically formed via an epitaxial deposition process that starts forming the structures at bottoms of the recesses 438. The p-type structures 440 are formed substantially below the extension regions 430 and, therefore, induce strain relatively deeply within the channel region. Additionally, the p-type structures 440 have p-type conductivity and a dopant concentration similar to surrounding portions of the p-type well region 406. The p-type structures 440 are comprised of a tensile strain inducing material such as silicon-carbon and have a composition selected to provide a desired amount of strain.

FIG. 4I illustrates n-type strain inducing structures 442 form on the p-type strain inducing structures 440 within the recesses 438. The n-type strain inducing structures 442 are typically formed via an epitaxial deposition process that starts forming the structures at an upper surface of the p-type strain inducing structures 440. The n-type structures 442 are formed substantially within the extension regions 430 and on the p-type strain inducing structures 440. Additionally, the n-type structures are formed having n-type conductivity and a dopant concentration similar the formed extension regions 430. As with the p-type strain inducing structures 440, the n-type structures 442 are comprised of a tensile strain inducing material, such as silicon-carbon, and have a composition selected to provide a desired amount of strain.

FIG. 4J illustrates the device 402 after formation of recesses 444 within the PMOS region. A mask (not shown) is applied that exposes a portion of the active regions 411 and the extension regions 436 within the PMOS region. Subsequently, a recess etch is performed to form the recesses 444.

N-type strain inducing structures 446 are then formed in the recesses 444 as shown in FIG. 4K. The n-type strain inducing structures are typically formed via an epitaxial deposition process that starts forming the structures at bottoms of the recesses 444. The n-type structures 446 are formed substantially below the extension regions 436 and, therefore, induce strain relatively deeply within the channel region. Additionally, the n-type structures 446 have n-type conductivity and a dopant concentration similar to surrounding portions of the n-type well region 408. The n-type structures 446 are comprised of a compressive strain inducing material such as silicon-germanium, and have a composition selected to provide a desired amount of strain.

FIG. 4L illustrates p-type strain inducing structures 448 form on the p-type strain inducing structures 448 within the recesses 444. The p-type strain inducing structures 448 can be formed via an epitaxial deposition process that starts forming the structures at an upper surface of the p-type strain inducing structures 448. However, other suitable formation processes can be employed. The p-type structures 448 are formed substantially within the extension regions 436 and on the n-type strain inducing structures 446. Additionally, the p-type structures 448 are formed having p-type conductivity and a dopant concentration similar the formed extension regions 436. As with the n-type strain inducing structures 446, the p-type structures 448 are comprised of a compressive strain inducing material, such as silicon-germanium, and have a composition selected to provide a desired amount of strain.

Sidewall spacers 450 are then formed over the offset spacers 416 on the lateral edges of the gate structures. The sidewall spacers 450 are formed by depositing an insulating sidewall material in a generally conformal manner over the device and subsequently subjected to an anisotropic etch to remove the insulating material on top of the gate and over the active areas, leaving sidewall spacers 450 in both the NMOS and PMOS regions, as illustrated in FIG. 4M.

FIG. 4N depicts source and drain regions 452 formed in the NMOS and PMOS regions. The source and drain regions 452 are formed by implanting suitable dopants, such as arsenic and/or phosphorous for n-type and boron for p-type. The implants are performed with the mask (not shown) to selectively implant the NMOS region with an n-type dopant and the PMOS region with a p-type dopant. As can be seen in FIG. 4N, the source/drain regions 452 are self-aligned with respect to the sidewall spacers 450, and thus are laterally spaced from the extension regions 430 and 436.

Continuing, silicide regions 454 are formed on active regions and gate electrodes 414 by a suitable silicidation process. FIG. 4O depicts the semiconductor device after formation of the silicide regions 454. Typically, silicide regions 454 are formed by depositing a refractory metal (e.g., nickel, cobalt, titanium, alloys thereof, and the like) over the device and inducing (e.g., by annealing) the deposited refractory metal to react with underlying silicon forming silicide regions that reduce contact resistance between active regions and electrodes with contacts, interconnects, and the like. Un-reacted refractory metal is then removed. Subsequently, back end processing including metallization may be performed to interconnect various transistors, as may be desired.

Figure 5:
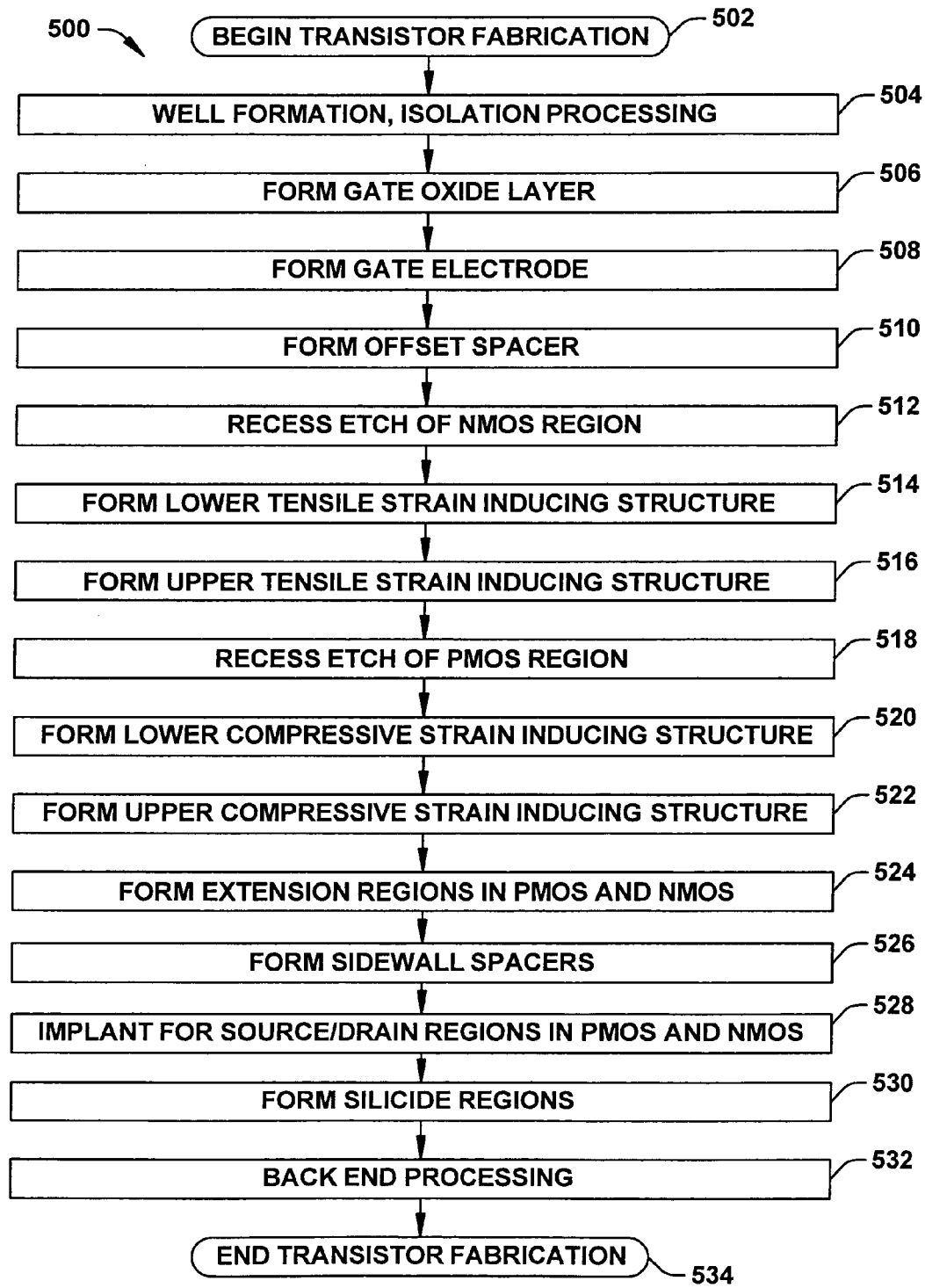
FIG. 5 is a flow diagram illustrating a method of fabricating a semiconductor device having multiple strain inducing recess structures in accordance with an aspect of the present invention.

FIG. 5 is a flow diagram illustrating a method 500 of fabricating a semiconductor device having multiple strain inducing recess structures in accordance with an aspect of the present invention. The method 500 is similar to the method 300 of FIG. 3, except that the method 500 forms extension regions subsequent to forming the multiple strain inducing recess structures. As a result, the strain inducing recess structures can be formed with a doping compatible with well regions formed therein.

The method 500 begins at 502, wherein transistor fabrication is initiated, and transistor well formation and isolation processing is performed at 504 thereby defining NMOS and PMOS regions, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) that serve to define various active areas and electrically isolate various active areas laterally from one another.

The method 500 continues at 506, wherein a gate oxide layer is formed in active areas defined by the various formed isolation regions. A conductive gate layer is then deposited over the gate oxide at 508 and patterned to form a conductive gate electrode. For example, a polysilicon layer may be deposited via chemical vapor deposition (CVD) and patterned via etching to form gate electrodes in both NMOS and PMOS regions, respectively.

An offset spacer is then formed on lateral edges of the conductive gate electrodes at 510. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate.

A mask is applied that exposes a portion of the active regions within the NMOS region and a recess etch is performed at block 512. The recesses are formed to a relatively low depth, for example a depth of about 5 nm to about 100 nm. In one example, the recesses are formed using a dry etching process, such as the chemistry employed to etch STI trenches in the semiconductor body when forming isolation regions.

Lower tensile strain inducing structures are then formed in the recesses at block 514 within the NMOS region. The strain inducing structures are typically formed via an epitaxial deposition process that starts forming the structures at bottoms of the recesses. The lower tensile strain inducing structures have p-type conductivity and a dopant concentration similar to surrounding portions of the well regions. The lower tensile strain inducing structures are comprised of a tensile strain inducing material such as silicon-carbon and have a composition selected to provide a desired amount of strain.

Upper tensile strain inducing structures are subsequently formed in the recesses on the lower tensile strain inducing structures at block 518. Similarly, the upper tensile strain inducing structures are typically formed via an epitaxial deposition process that starts forming the structures on an upper surface of the lower tensile strain inducing structures. The upper tensile strain inducing structures are formed so as to substantially fill the recesses. Additionally, the upper tensile strain inducing structures are formed having p-type conductivity and a dopant concentration similar the p-type well regions. Alternately, the upper tensile strain inducing structures are formed undoped. In an alternate aspect, the upper tensile strain inducing structures are formed with a dopant conductivity similar to the well region but with a dopant concentration higher than the one of the well region. In this case the upper tensile strain inducing structure can confine the extension region during further processing. It is noted that this contrasts with the method 300, which formed an upper strain inducing structure having a conductivity opposite that of the well region. Additionally, it is noted that within the upper tensile strain inducing structures and the lower tensile strain inducing structures, the composition of the strain inducing material can be tailored to selectively apply strain to the channel regions.

A mask is applied that exposes a portion of the active regions within the PMOS region and a recess etch is performed at block 518. The recesses are formed to a relatively low depth, for example a depth of about 5 nm to about 100 nm.

Lower compressive strain inducing structures are then formed within the recesses at block 520. The lower compressive strain inducing structures are generally formed via an epitaxial deposition process that starts forming the structures at bottoms of the recesses. The lower compressive strain inducing structures have n-type conductivity and a dopant concentration similar to surrounding portions of the well regions of the PMOS region. The lower compressive strain inducing structures are comprised of a strain inducing material such as silicon-germanium and have a composition selected to provide a desired amount of strain. Typically, the strain inducing material employed for the PMOS region, such as silicon-germanium, produces a compressive strain.

A formation process for forming silicon germanium is an epitaxial formation process that utilizes bottom surfaces of the recessed active regions as a seed for the growth process, such as, chemical vapor deposition (CVD) and/or molecular beam epitaxy (MBE), and the like. Source gases for silicon and germanium are employed to control the composition of the filled recess structures. The flow of the source gases and/or flux of source atoms can be controlled to alter the composition of the strain producing material and one or more n-type dopants can be introduced during the formation process.

Upper compressive strain inducing structures are subsequently formed in the recesses on the lower compressive strain inducing structures at block 522. Similarly, the upper compressive strain inducing structures are typically formed via an epitaxial deposition process that starts forming the structures on upper surfaces of the lower compressive strain inducing structures. Additionally, the upper compressive strain inducing structures are formed having n-type conductivity and a dopant concentration similar the well region formed therein. It is noted that the strain inducing material and/or the composition can vary for the lower compressive strain inducing structures and upper compressive strain inducing structures of the PMOS region in order to selectively apply strain to the channel regions. Additionally, it is noted that within the lower compressive strain inducing structures and upper compressive strain inducing structures within the PMOS region, the composition of the strain inducing material can be tailored to selectively apply strain to the channel regions.

It is appreciated that the upper and lower strain inducing structures can, in some aspects, be formed as a single structure. Additionally, it is also appreciated that the upper and lower strain inducing structures can respectively comprise multiple layers of material, some of which can be non strain inducing.

An extension region implant is then performed at 524 to form extension regions, wherein dopants are introduced into active regions of the device, including the upper compressive strain inducing structures for both the NMOS and PMOS regions. In an exemplary extension region formation process, lightly doped, medium doped or heavily doped extension region implants are performed in the NMOS and PMOS regions, respectively, wherein the gate structure serves to self-align the extension regions. A thermal process such as a rapid thermal anneal can then be employed to activate the extension region dopants, which causes the extension regions to diffuse laterally slightly underneath the offset spacer toward the channels.

Still referring to FIG. 5, sidewall spacers are then formed on the gate structures at 526. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

Source/drain regions are then formed in the PMOS and NMOS regions by implanting p-type dopants (e.g., boron) in the PMOS region and n-type dopants in the NMOS region at block 528. Typically, an NSD mask is employed to expose the NMOS region and implant the n-type dopants and a PSD mask is employed to expose the PMOS region and implant the p-type dopants in a subsequent implantation. The source/drain dopants are introduced into the exposed areas (top of gate electrode and active areas not covered by the sidewall spacers). Subsequently, a thermal process can then be performed to activate dopants within the source/drain regions of both the NMOS and PMOS regions.

Subsequently, silicide processing is performed at block 530, wherein a refractory metal material is formed over the device, followed by a thermal process, wherein the metal and silicon interfaces react to form a silicide (on top of the gate and in the source/drain regions). Unreacted metal is then stripped away, and back end processing, such as interlayer dielectric and metallization layers formation, is performed at 532 to conclude the device formation at 534.

While, for purposes of simplicity of explanation, the methodologies of FIGS. 1, 3 and 5 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a semiconductor device comprising:
   forming gate structures and defining active regions on the semiconductor device;

forming extension regions having a first type conductivity within the active regions;

forming recesses within at least a portion of the defined active regions to a depth below the formed extension regions;

forming second type recess structures within the formed recesses at least partially below the formed extension regions, wherein the second type recess structures have a second type conductivity opposite the first type conductivity and are comprised of a first strain inducing material; and forming first type recess structures within the formed recesses, on the second type recess structures, and substantially within the formed extension regions, wherein the first type recess structures have the first type conductivity and are comprised of a second strain inducing material.

2. The method of claim 1, wherein the first type conductivity is p-type and the second type conductivity is n-type.

3. The method of claim 1, wherein forming the second type recess structures comprises forming silicon-germanium within the recesses via an epitaxial deposition process.

4. The method of claim 1, wherein forming the second type recess structures comprises forming silicon-carbon within the recesses via an epitaxial deposition process.

5. The method of claim 1, wherein forming the second type recess structures comprises depositing the strain inducing material while controlling dopant concentration to match a dopant concentration of the active regions.

6. The method of claim 5, wherein forming the second type recess structures further comprises adjusting composition of the first strain inducing material while depositing the first strain inducing material to tailor strain produced.

7. The method of claim 1, wherein forming the second type recess structures comprises depositing multiple layers of the first stain inducing material, wherein individual layers have a dopant concentration and a material composition.

8. The method of claim 1, wherein forming the first type recess structures comprises depositing the second strain inducing material while controlling dopant concentration to match a dopant concentration of the extension regions.

9. The method of claim 1, further comprising forming offset spacers prior to forming the extension regions, forming sidewall spacers after forming the first type recess structures, and forming source/drain regions in the active regions after forming the sidewall spacers.

10. A method of fabricating a semiconductor device comprising:

performing well formation and isolation processing in a semiconductor body;

forming a gate oxide layer on the semiconductor body;

forming gate electrodes on the gate oxide layer;

forming offset spacers on lateral edges of the gate electrodes;

forming extension regions in the semiconductor body in NMOS and PMOS regions;

performing a recess etch of portions of active regions within the NMOS region to form recesses;

forming p-type recess structures within the recesses of the NMOS region that are substantially below the formed extension regions and are comprised of tensile strain producing material;

forming n-type recess structures within the recesses of the NMOS region and on the p-type recess structures that are comprised of a tensile strain producing material;

performing a recess etch of portions of the active regions within the PMOS region to form recesses;

forming n-type recess structures within the recesses of the PMOS region that are substantially below the formed extension regions and are comprised of compressive strain producing material; and forming p-type recess structures within the recesses of the PMOS region and on the n-type recess structures that are comprised of a compressive strain producing material.

11. The method of claim 10, further comprising forming sidewall spacers adjacent the offset spacers.

12. The method of claim 11, further comprising forming source/drain regions in the NMOS and PMOS regions and forming silicide regions on the source/drain regions and the gate electrodes.

13. The method of claim 10, wherein forming p-type recess structures comprises forming multiple layer of strain inducing material, wherein individual layers have varied dopant concentration and composition of the strain inducing material.

14. A method of fabricating a semiconductor device comprising:

performing well region formation and isolation processing in a semiconductor body;

forming a gate oxide layer on the semiconductor body;

forming gate electrodes on the gate oxide layer;

forming offset spacers on lateral edges of the gate electrodes;

performing a recess etch of portions of active regions within the NMOS region to form recesses having a relatively low depth;

forming lower tensile strain inducing structures within the recesses of the NMOS region;

forming upper tensile strain inducing structures within the recesses on the lower tensile strain inducing structures;

performing a recess etch of portions of the active regions within the PMOS region to form recesses;

forming lower compressive strain inducing structures within the recesses of the PMOS region; and forming upper compressive strain inducing structures within the recesses of the PMOS region and on the lower compressive strain inducing structures.

15. The method of claim 14, further comprising forming extension regions in the semiconductor body in NMOS and PMOS regions after forming the upper tensile strain inducing structures and the upper compressive strain inducing structures.

16. The method of claim 14, further comprising forming extension regions in the semiconductor body in NMOS and PMOS regions prior to forming the lower tensile strain inducing structures and the lower compressive strain inducing structures.

17. The method of claim 14, wherein forming the lower tensile strain inducing structures comprises depositing a seed material and growing tensile strain inducing material from the seed material while doping with a suitable dopant to attain a desired conductivity type and dopant concentration.

18. The method of claim 14, wherein forming the upper tensile strain inducing structures comprises depositing a seed material and growing tensile strain inducing material from the seed material while doping with a suitable dopant to attain a desired conductivity type and dopant concentration.

19. The method of claim 18, wherein the desired conductivity type is opposite that of the well region.

20. The method of claim 18, wherein the desired conductivity type matches the well region and the dopant concentration is higher than a dopant concentration of the well region.

21. The method of claim 14, wherein forming the lower compressive strain inducing structures comprises depositing a seed material and growing compressive strain inducing material from the seed material while doping with a suitable dopant to attain a desired conductivity type and dopant concentration.

22. The method of claim 21, wherein the desired conductivity type and the dopant concentration match the well region.

\* \* \* \* \*